(12) United States Patent
Cetel et al.

(10) Patent No.: US 9,138,963 B2
(45) Date of Patent: Sep. 22, 2015

(54) LOW SULFUR NICKEL BASE SUBSTRATE ALLOY AND OVERLAY COATING SYSTEM

(75) Inventors: Alan D. Cetel, West Hartford, CT (US); Dilip M. Shah, Glastonbury, CT (US)

(73) Assignee: UNITED TECHNOLOGIES CORPORATION, Hartford, CT (US)

( * ) Notice: Subject to any disclaimer, the term of this patent is extended or adjusted under 35 U.S.C. 154(b) by 910 days.

(21) Appl. No.: 12/636,868

(22) Filed: Dec. 14, 2009

(65) Prior Publication Data

US 2011/0143164 A1 Jun. 16, 2011

(51) Int. Cl.

| | |
|---|---|
| B22D 19/00 | (2006.01) |
| C22C 19/00 | (2006.01) |
| B32B 15/00 | (2006.01) |
| C22C 19/05 | (2006.01) |
| B32B 15/01 | (2006.01) |
| C22C 1/02 | (2006.01) |
| C22C 19/03 | (2006.01) |
| C23C 4/02 | (2006.01) |
| C23C 4/08 | (2006.01) |
| C23C 14/02 | (2006.01) |
| C23C 14/16 | (2006.01) |
| C30B 29/52 | (2006.01) |

(52) U.S. Cl.
CPC .............. B32B 15/00 (2013.01); B22D 19/00 (2013.01); B32B 15/01 (2013.01); C22C 1/02 (2013.01); C22C 1/023 (2013.01); C22C 19/03 (2013.01); C22C 19/05 (2013.01); C22C 19/056 (2013.01); C22C 19/057 (2013.01); C23C 4/02 (2013.01); C23C 4/085 (2013.01); C23C 14/028 (2013.01); C23C 14/16 (2013.01); C30B 29/52 (2013.01); *Y10T 428/12493* (2015.01); *Y10T 428/12944* (2015.01)

(58) Field of Classification Search
USPC ................. 420/441, 442, 445–455, 459, 460; 428/680
See application file for complete search history.

(56) References Cited

U.S. PATENT DOCUMENTS

| 4,127,410 A | 11/1978 | Merrick et al. |
| 4,774,149 A | 9/1988 | Fishman |
| 4,895,201 A | 1/1990 | DeCrescente et al. |
| 5,334,510 A | 8/1994 | Usui et al. |
| 5,344,510 A * | 9/1994 | Allen et al. ................... 148/675 |
| 5,346,563 A | 9/1994 | Allen et al. |
| 5,538,796 A | 7/1996 | Schaffer et al. |
| 5,540,789 A | 7/1996 | Bornstein et al. |
| 5,866,271 A * | 2/1999 | Stueber et al. ............... 428/545 |

(Continued)

FOREIGN PATENT DOCUMENTS

| EP | 0676489 A1 | 10/1995 | |
| EP | 1642993 * | 4/2006 | ............... C23C 4/10 |

OTHER PUBLICATIONS

Caron et al., "Evolution of Ni-based superalloys for single crystal gas turbine blade applications", Aerospace Science & Technology Journal, vol. 3 (1999), pp. 513-523.*

(Continued)

*Primary Examiner* — Humera Sheikh
*Assistant Examiner* — Lucas Wang
(74) *Attorney, Agent, or Firm* — Bachman & LaPointe, P.C.

(57) ABSTRACT

A coated article having an improved coating oxidation life includes a superalloy substrate material having a composition which includes sulfur, herein the sulfur is present in an amount less than 1 ppm; and an overlay coating formed over a surface of the substrate material.

11 Claims, 5 Drawing Sheets

(56) References Cited

U.S. PATENT DOCUMENTS

| | | | |
|---|---|---|---|
| 5,922,148 | A | 7/1999 | Irvine et al. |
| 6,333,121 | B1 | 12/2001 | Walston et al. |
| 6,391,475 | B1 | 5/2002 | Spitsberg et al. |
| 6,551,423 | B1* | 4/2003 | Spitsberg et al. ............ 148/518 |
| 6,652,982 | B2 | 11/2003 | Spitsberg et al. |
| 6,797,408 | B2 | 9/2004 | Walston et al. |
| 2002/0048683 | A1* | 4/2002 | Walston et al. ............... 428/633 |
| 2002/0094447 | A1* | 7/2002 | Spitsberg ...................... 428/632 |
| 2003/0033702 | A1* | 2/2003 | Berry et al. ................. 29/402.03 |
| 2005/0036892 | A1* | 2/2005 | Bajan ........................ 416/241 R |
| 2006/0039820 | A1* | 2/2006 | Darolia et al. ................ 420/444 |
| 2007/0138019 | A1* | 6/2007 | Kasule .......................... 205/191 |
| 2009/0185944 | A1* | 7/2009 | Hu ................................ 420/448 |
| 2009/0291016 | A1* | 11/2009 | Yamada et al. ............... 420/586 |
| 2009/0317287 | A1* | 12/2009 | Hu ................................ 420/443 |

OTHER PUBLICATIONS

J.L. Smialek: Superalloys 1996—The Control of Sulfur Content in Nickel-Base Single Crystal Superalloys and its Effects on Cyclic Oxidation Resistance; Sep. 1, 1996; TMS; USA; XP002629918; pp. 71-80.

O.P. Sinha et al.; Effect of Residual Elements on High Performance Nickel Base Superalloys for Gas Turbines and Strategies for Manufacture; Bulletin of Materials Science; vol. 28, No. 4; Jul. 1, 2005; pp. 379-382; XP002629919; India.

David John Young: High Temperature Oxidation and Corrosion of Metals; Jan. 1, 2008; Elsevier; Netherlands; XP002629920; pp. 342-343.

* cited by examiner

LOW SULFUR NICKEL BASE SUBSTRATE ALLOY AND OVERLAY COATING SYSTEM

BACKGROUND

The present disclosure is directed to a low sulfur nickel base substrate alloy and overlay coating system which results in excellent high temperature oxidation resistance.

For high temperature application of such components as blades and vanes in aeroengines or industrial gas turbines, equiaxed, columnar grain, or single crystal nickel base superalloys are typically used to achieve structural strength. Single crystal implies that the atomic arrangement all through the material is highly ordered and specific crystallographic directions can be associated with the material from one end to the other. When a material is made up of a large number of single crystal grains randomly oriented, the structure is considered to be equiaxed. If there are multiple columns of single crystal grains bundled together, the structure is referred to as columnar grain. Since such structure can only be generated using directional solidification, it is often referred to as directionally solidified material.

Superalloys refer to a class of nickel base alloys typically with alloying additions of Cr, Co, Mo, W, Re, Ru, Ti, Ta, and Al. Of these, the primary purpose of adding Al is to produce a dispersion of precipitates referred to as γ', which is known to be an ordered intermetalic with structure similar to $Ni_3Al$. The dispersion of γ' precipitates, which is about 0.3 to 0.5 microns in size, is contained in a matrix which is referred to as the γ matrix. Elements such as Ti and Ta are known to largely replace Al in the γ' precipitates, while elements such as Mo and Re are known to exclusively stay in the γ matrix. Other elements partition between the precipitate and matrix in a complex manner. If these alloys have an equiaxed or columnar grain microstructure, then they typically contain minor alloying additions of C, B, Zr and Hf to enhance the strength of grain boundaries and consequently enhance ductility of the alloys. The presence of Al also serves another function in that it enables alloys to form a protective alumina layer, which slows down the loss of metal due to oxidation in high temperature environment.

SUMMARY

The present disclosure is primarily concerned with minimizing the sulfur concentration in a superalloy class of alloys, specifically when used in conjunction with high temperature oxidation resistant coatings, applied as a distinct layer like a paint, with minimal interdiffusion, generally referred to as an overlay coating.

The present disclosure relates to a coated article having an improved coating oxidation life, which article comprises: a cast superalloy substrate material having a composition which includes sulfur, which sulfur is present in an amount less than 1 ppm by weight, and an overlay coating containing nickel, cobalt, chromium, aluminum, and yttrium formed over a surface of said substrate material without any sulfur modifying element being pre-deposited onto a surface of the substrate. Unless specified otherwise, all concentrations set forth herein are by weight.

The present disclosure further relates to a process for forming a coated article having an improved coating oxidation life comprising the steps of: providing a superalloy substrate material having a composition which includes sulfur, wherein said sulfur is present in an amount less than 1 ppm, and forming an overlay coating over a surface of said substrate material.

Still further, the present disclosure relates to formulation of a master heat material for casting a single crystal nickel based superalloy substrate material, wherein the master heat material contains active elements in such a way that [wt. ppm of Mg]+[(24/40)×(wt. ppm of Ca)]+[(24/89)×(wt. ppm of Y)]+[(24/atomic weight of any other active element)×(wt. ppm of the said active element)] is greater than or equal to 20.

Other details of the low sulfur nickel base substrate alloy and coating system of the present disclosure are set forth in the following detailed description and the accompanying drawings.

DETAILED DESCRIPTION OF THE PREFERRED EMBODIMENT(S)

Figure 1:
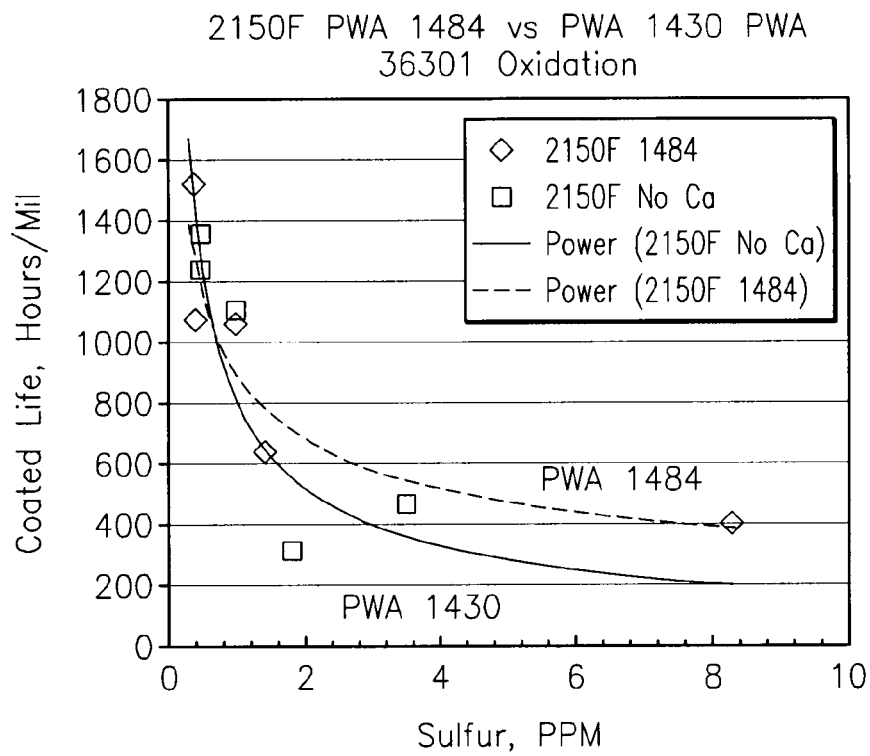
FIG. 1 is a graph showing the increase in coating oxidation life which can be obtained by reducing the sulfur content in a substrate superalloy to less than 1 ppm.

It is known that reducing sulfur in nickel base alloys improves high temperature oxidation resistance by improving the adherence of a protective alumina film at an alloy surface. One theory is that sulfur migrates to the interface between the alumina and the alloy and weakens the bonding causing early spallation of the protective alumina. Nickel base alloys here implies both structural superalloys and nickel base coatings with higher concentration of Al and distinctly different compositions and phases. Alternatively, instead of reducing sulfur in alloys, if the alloys contain elements such as Mg, Ca, Y, Hf and Zr and/or other rare earth elements with a strong affinity for sulfur, effectively the concentration of free sulfur is reduced, and the ultimate result is improved oxidation resistance.

A synergistic and surprisingly unpredictable effect is achieved when the substrate alloy of an article such as a turbine engine component, i.e. blade, vane, etc., contains very low sulfur, i.e. less than 1 ppm by weight, and an overlay coating is applied over the substrate alloy. It has been surprisingly found that the oxidation resistance of the overlay coated superalloy is significantly influenced by the sulfur content of the substrate alloy, even though the overlay coating itself may contain a large amount of active element Y, which heretofore was believed to effectively tie up all the S present in the coating or coming from the substrate.

To better appreciate the preceding paragraph, it is necessary to understand the role of coatings. In spite of the presence of aluminum in the load bearing superalloy material described above, the oxidation resistance of the structural material is not sufficient for hollow components to survive the economically viable time duration required in operation. This deficiency of the primary load bearing structural alloy is overcome by coating the material with another nickel base alloy coating containing higher amounts of Al, providing oxidation resistance for significantly longer duration. In contrast to the superalloys, which primarily contain γ matrix and γ' precipitates as described before, the coatings primarily consists of another aluminum-rich phase generally referred to as a β phase, which is a nickel base intermetallic NiAl.

There are two major classes of coatings. In one class of coatings, generally referred to as diffusion coatings, the base alloy surface is enriched with Al to improve its oxidation resistance. Such coatings consume part of the base alloy and become an integral part of the surface of the original material through inter-diffusion. Such coatings are typically applied by controlled chemical reaction liberating Al in the vicinity of the surface of the base alloy. Performance of such coatings may be improved by incorporating precious elements such as Pt into the coating by interdiffusion. Currently, diffusion coatings are broadly categorized into two groups. Those without the precious elements are referred to as simply "aluminide" coatings and those containing Pt are referred to as "platinum aluminide" coatings. Since these coatings become an integral part of the base alloys, it is easy to understand that the presence of sulfur in the base alloy as well as that brought by the coating process will influence the oxidation performance of the coated system. In the diffusion coatings, there is no known simple way to incorporate active elements to tie up free sulfur to improve oxidation performance. Thus, reducing the total sulfur in the substrate alloy in a diffusion coated alloy system is the only possible way to improve alumina adherence.

In contrast to diffusion coatings, the second class of coatings, which is referred to as overlay coatings, is applied by physically bringing a separate alloy composition to lie on top of the base superalloy material with limited interdiffusion. There are many processes by which this can be done. These include electron beam physical vapor deposition (EBPVD), plasma spray, high velocity oxy-fuel (HVOF), and cathodic arc deposition. Part of the coating reacts with the base alloy, but the reaction is relatively limited and for all practical purposes, the coating stands as a distinctly different layer. Such nickel base overlay coatings are also referred to as MCrAlY coatings, where M is either Ni, Co or Fe, or a combination of these elements as the base, and Cr, Al, and Y are principal constituents of the coating composition. These coatings differ significantly from the diffusion coatings in that the overlay coatings can incorporate a higher level of Cr and active elements such as Y. Higher levels of Cr also helps oxidation resistance. The addition of active elements such as Y is done for the sole purpose of reducing free S in the coating and consequently its deleterious effect on the oxidation resistance of the coating. Since these overlay coating compositions are formulated independently of the base superalloy, specific coating compositions may contain many additional elements such as Ta, Re, Mo and W which are beneficial to mechanical performance. There are two types of overlay coatings. Those with Al contents >12 wt % are referred to as β coatings which form a high volume fraction of NiAl intermetallic phase. The other type of overlay coating with Al content of 8 to 14 wt % is referred to as a γ/γ' coating with a high volume fraction of the $Ni_3Al$ intermetallic phase.

Most relevant to the disclosure herein is the fact that in contrast to diffusion coatings, the overlay coatings typically contain the active element Y at a concentration of almost 5000 ppm by weight, whereas the typical concentration of sulfur in the coating is from 2 to 5 ppm by weight and in the base alloy generally less than 10 ppm by weight. With such a large amount of active element to effectively tie up such low concentration of sulfur, it is conventionally believed by those knowledgeable of high temperature oxidation mechanisms, (along with the combination of high concentrations of Al and Cr in the overlay coating), the substrate composition would have little influence on the oxidation resistance of the coating/substrate system. It has been assumed that any sulfur in the base superalloy would be effectively tied up by the high concentration of the active element yttrium in the coating, and not cause any detrimental effect to oxidation behavior.

It is also possible that the assumption that base alloy composition cannot influence the oxidation performance of the overlay coated material originated from the fact that the oxidation resistance of overlay coatings was at least an order of magnitude better than the base alloy. It is also possible that a high amount of the active element Y present in the overlay coating is not present as elemental Y but is present as yttria ($Y_2O_3$, yttrium oxide) because of the processing condition used to deposit the coating. Thus, the inventors herein have found that the assumption that there is sufficient free yttrium to tie up any sulfur coming from the substrate superalloy is incorrect. The fact is that current chemical analysis methods are either not technically advanced or cost effective in determining what form the yttrium is present in the coating. Also, it is critical to realize that tracking sulfur (S) at the trace level of ppm can currently only be done by glow discharge mass spectroscopy (GDMS) and this technique is neither cost effective nor has the fidelity to fully reveal all the interactions.

The superalloy material forming the substrate material may comprise a wide variety of superalloy materials. For example, the superalloy material may have a composition which includes from 4 to 30 wt % cobalt, from 1.5 to 30 wt % chromium, up to 20 wt % tungsten, up to 10 wt % rhenium, up to 10 wt % niobium, from 2 to 15 wt % tantalum, up to 5 wt % titanium, from 3 to 7 wt % aluminum, up to 15 wt % molybdenum, up to 5 wt % iron, up to 10 wt % ruthenium, up to 5 wt % iridium, up to 2.0 wt % zirconium, up to 3.0 wt % hafnium, up to 2.0 wt % silicon, sulfur in an amount less than 1.0 ppm, such as from 0.001 ppm to less than 1.0 ppm, and the balance nickel. The superalloy material may be cast as a single crystal material, an equiaxed material, or a columnar grain material. The superalloy material may have a gamma prime precipitate volume fraction anywhere from 20 to 75%, preferably around 65%, and a dendrite size from 5 to 1000 microns, preferably below 500 microns.

Exemplary superalloy compositions are shown in the following table.

| Alloy | CAST FORM | CR | Tl | Mo | W | Ta | Re | Al | Co | B | Zr | C | Hf | Ru | Y | Ni |
|---|---|---|---|---|---|---|---|---|---|---|---|---|---|---|---|---|
| A | Single Crystal | 4-7 | 0-0.5 | 1.5-2.5 | 5-7 | 6-9 | 2-4 | 5-6.2 | 8-12 | 0-.01 | 0-.01 | 0-.06 | .1-.5 | 0-2 | 0-.03 | bal |
| B | Single Crystal | 8-12 | 1-2 | 0-0.5 | 3-5 | 10-14 | 0 | 4.5-5.6 | 4-6 | 0-.01 | 0-.01 | 0-.06 | 0-.5 | 0 | 0-.03 | bal |

-continued

| Alloy | CAST FORM | CR | Tl | Mo | W | Ta | Re | Al | Co | B | Zr | C | Hf | Ru | Y | Ni |
|---|---|---|---|---|---|---|---|---|---|---|---|---|---|---|---|---|
| C | Single Crystal | 11-13 | 3.5-5 | 1-2 | 3-5 | 3-6 | 0 | 3-4 | 8-10 | 0-.01 | 0-.01 | .02-.10 | 0-.5 | 0 | 0 | bal |
| D | Single Crystal | 3-6 | 0-.5 | 1.5-2.5 | 8-10 | 8-10 | 0-1.5 | 5.5-6.5 | 10-13 | 0-.01 | 0-.01 | 0-.06 | .1-.5 | 0 | 0-.03 | bal |
| E | Single Crystal | 1.5-2.5 | 0-.5 | 1.5-2.5 | 5-7 | 7.5-8.5 | 2-4 | 5.5-6 | 14-18 | 0-.01 | 0-.01 | 0-.06 | .1-.5 | 2-4 | 0-.03 | bal |
| F | Single Crystal | 6-7 | 0-.5 | 1.5-2.5 | 5-7 | 6-7 | 0-3 | 6-6.5 | 6-9 | 0-.01 | 0-.01 | 0-.06 | .1-.2 | 0 | 0-.03 | bal |
| G | Single Crystal | 5-7 | .5-1.5 | .5-1.5 | 5-8 | 6-8 | 0-3 | 5.5-6.5 | 8-10 | 0-.01 | 0-.01 | 0-.06 | .1-.2 | 0 | 0-.03 | bal |
| H | DS | 5-7 | 0-.5 | 1.5-2.5 | 5-7 | 3-5 | 2-4 | 5.5-6.5 | 10-14 | .01-.02 | .02-.10 | .05-.15 | .5-2 | 0 | 0-.03 | bal |
| I | DS | 5.5-7.5 | 0-.5 | 1-2 | 4-6 | 5-7 | 2-4 | 5.5-6.5 | 10-14 | .01-.02 | .02-.10 | .05-.15 | .5-2 | 0 | 0-.03 | bal |
| J | Equiaxed | 7-9 | .5-1.5 | 5-7 | 0-1 | 4-5 | 0 | 5.5-6.5 | 8-12 | .01-.02 | .02-.1 | .05-.15 | 0-1.5 | 0 | 0 | bal |
| K | Equiaxed | 7-9 | .5-1.5 | .5-1.5 | 8-12 | 2-4 | 0 | 5-6 | 8-12 | .01-.02 | .02-.1 | .1-.2 | 0-1.5 | 0 | 0 | bal |
| L | Single Crystal | 2-5 | 0-.5 | .5-2.5 | 9-13 | 5-10 | 2-4 | 5.5-6.5 | 10-14 | 0-.01 | 0-.01 | 0-.06 | .1-.5 | 0 | 0-.03 | bal |

The overlay coating which is applied to the substrate may be applied by any known coating technique such as EBPVD, cathodic arc, HVOF, where the coating composition is distinct from the superalloy substrate composition and is physically brought to lie on top of the superalloy substrate. The overlay coating may have a composition in the range of up to 30 wt % cobalt, from 5 to 40 wt % chromium, from 5 to 20 wt % aluminum, from 0.01 to 5.0 wt % yttrium, up to 1 wt. % Zr, from 0 to 5.0 wt % niobium, up to 5.0 wt % tantalum, up to 10 wt % iron, up to 5.0 wt % molybdenum, up to 5.0 wt % rhenium, up to 5.0 wt % ruthenium, up to 2.0 wt % iridium, up to 5.0 wt % hafnium, up to 5.0 wt % silicon, up to 30 wt. % Pt, and the balance nickel.

It is desirable for the overlay/superalloy system to have a higher surface area between the coating and the base substrate material. In order to obtain this higher surface area, one may use rough polishing, grit blasting, oil honing, or rough machining, and similar such mechanical means. In addition, shot peening or laser shot peening or similar such techniques may be employed, which may subsequently lead to fine grain recrystallization, and increase in grain boundary surface area. The increased surface area may also be created by introducing particles of inert second phase into the coating or between the coating and the substrate. The particles may be alumina or other oxide particles, nitride particles, and/or carbide particles, which are introduced either externally or formed by internal oxidation or reaction of other chemical means. In all these cases, direct measurement of surface area is a difficult task. Indirectly their effectiveness may be measured by amount of sulfur segregation at the coating/superalloy substrate by glow discharge mass spectrometry(GDMS) depth profile or improvement in oxidation resistance. This approach relies on the fact that creation of larger surface area leads to higher entrapment of sulfur, allowing less free sulfur to migrate between the protective alumina and the coating. Typically it is known that when the substrate contains about 1 ppm sulfur, the normal interface between the coating and the substrate traps almost 20 ppm sulfur. Thus simplistically if the interface surface area is doubled, the amount of trapped sulfur will double, thereby proportionately reducing the free sulfur. Such an approach then can additionally help the system to become much more robust and tolerant to variation in the sulfur content in the substrate.

If desired, the outer surface of the overlay coating may be purposely roughened up to increase the interface area between an outer protective alumina film layer and the overlay coating. Here again the intent is to dilute sulfur per unit area of alumina/coating interface and render it less damaging.

If desired, a ceramic coating may be formed over the overlay coating, which ceramic coating functions as a thermal barrier coating (TBC). The presence of a low sulfur substrate under a TBC/bond-coat system will enhance TBC spallation life by increasing thermally grown oxide(TGO)-ceramic bond strength.

Figure 2:
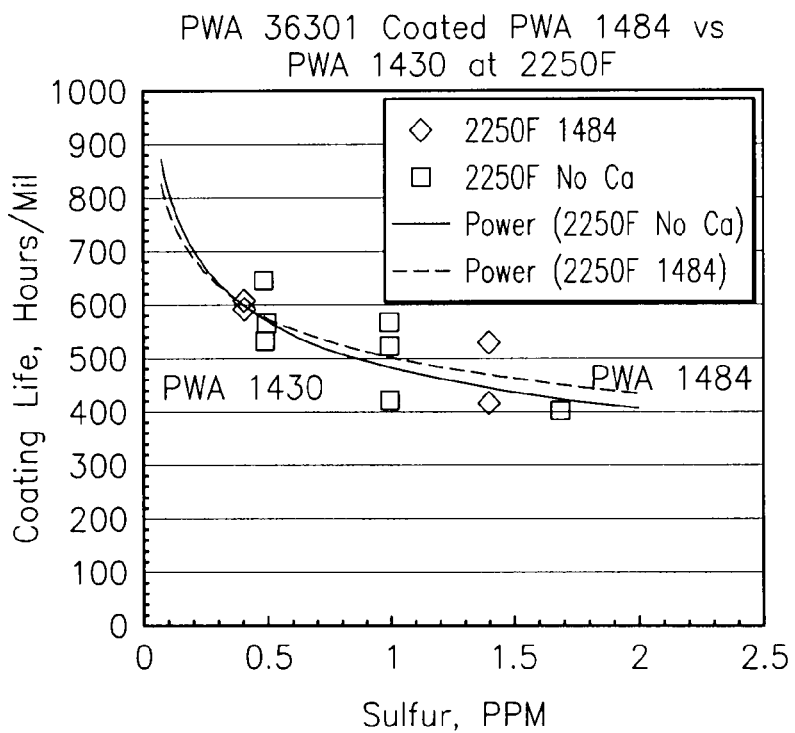
FIG. 2 is a graph showing the increase in coating oxidation life which can be obtained by reducing the sulfur content in a substrate superalloy to less than 1 ppm.
Figure 3:
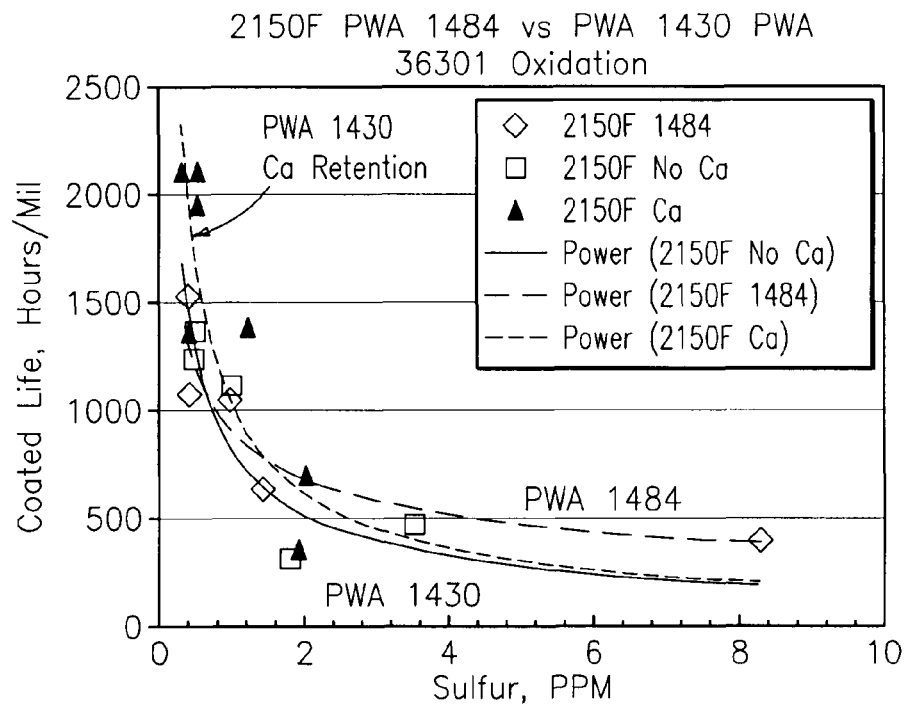
FIG. 3 is a graph showing the effect of calcium retention on increased coating oxidation life for nickel based superalloys having a sulfur content of less than 1 ppm.
Figure 4:
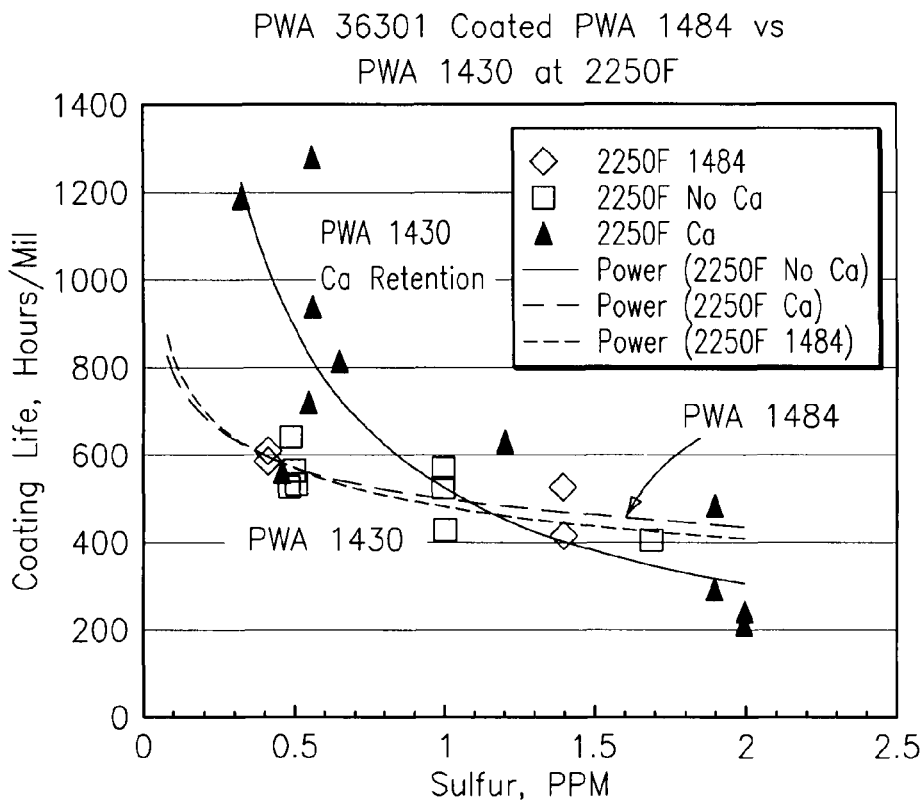
FIG. 4 is a graph showing the calcium retention and increased coating oxidation life for nickel based superalloys having a sulfur content of less than 1 ppm.
Figure 5:
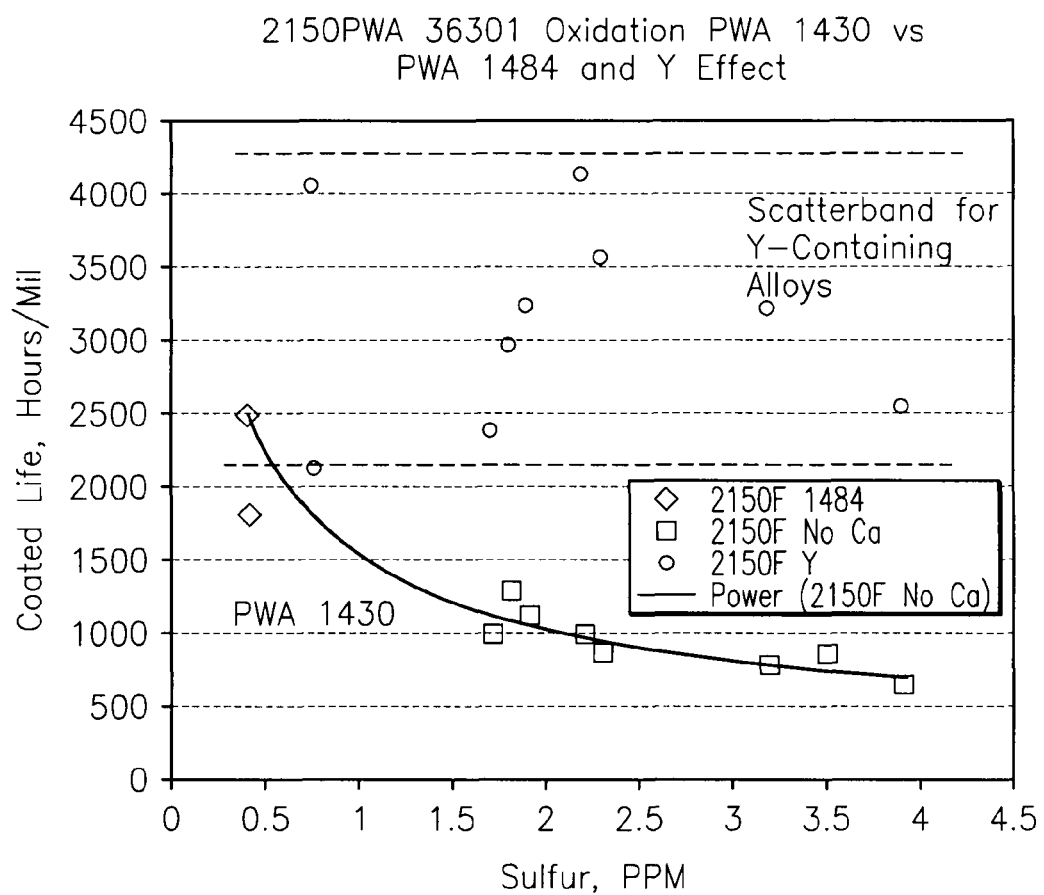
FIG. 5 is a graph showing how with yttrium additions to a NiCoCrAlY coating oxidation resistance becomes insensitive to sulfur in the substrate.

FIGS. 1-5 herein reflect experimental evidence that low sulfur content of the base superalloy material and/or the presence of yttrium or other active elements (Mg, Ca, etc.) in the base superalloy has a significant and unexpected influence on the performance of the overlay coating/substrate system. FIG. 1 is a plot of coating life for a NiCoCrAly overlay coating applied by a cathodic arc technique vs. sulfur concentration in the base superalloys (PWA 1484 and PWA 1430). The coating life is measured in terms of hours it takes to defeat 1 mil (0.001 in.) of coating through oxidation at 2150° F. in a standard burner rig test. Clearly the figure shows a five fold increase in the time it takes to oxidize 1 mil of coating when the sulfur content is reduced from 5 ppm to <1 ppm, in either alloy. FIG. 2 is a plot similar to FIG. 1, except at a higher temperature of 2250° F. FIG. 3 shows that coating life at 2150° F., is further improved with the retention of active element such as Ca, at the same concentration of sulfur in the base alloy, provided the sulfur is <1ppm. FIG. 4 shows similar effect as FIG. 3 at a higher temperature of 2250°. PWA 1484 and PWA 1430 represent superalloys with diverse alloy compositions. PWA 1484 contains 3 wt % rhenium, while PWA 1430 contains no rhenium. PWA 1484 has 5.9 wt % tungsten, whereas PWA 1430 has approximately 50% more tungsten. All the figures are plotted as the time it takes to defeat 0.001" or 1 mil of coating by oxidation in a controlled burner rig test at a given temperature vs. sulfur content of the super alloy substrates. All the figures show that the time to coating defeat due to oxidation is significantly increased when the sulfur content in the base superalloy is reduced, and especially when sulfur content starts falling below 1 ppm by weight. FIGS. 3 and 4 show that retention of active elements such as calcium in the base superalloy material also helps to improve oxidation resistance of the coated system, in addition to benefits provided by reducing the sulfur content at the processing stage.

It is important to reiterate that in spite of the fact that the overlay coating may contain approximately 5000 ppm Y and approximately 2 ppm sulfur, lowering of the sulfur in the base superalloy material substrate, and/or retaining 10 ppm of magnesium or equivalent to that of any active element, such as calcium, in the substrate has a dramatic influence on the high temperature oxidation resistance of the coating system. The term equivalent here implies equivalent in terms of atom %, and such equivalence can be approximately determined as [10×(atomic weight of the active element)/24]. This does not exist with diffusion coatings where the only element brought from an external source is aluminum, and an active element such as yttrium cannot be introduced in the coating. Moreover, since the diffusion coating becomes an integral part of the substrate superalloy material, it is a lot simpler to understand the influence of sulfur concentration in the base alloy influencing the oxidation performance of the coating substrate system.

Since sulfur is a tramp element, aiming to have its concentration below 1 ppm in the final superalloy article critically depends on the processing pathway. Typically, to make superalloy components, master heat alloy material is prepared in batches of 5,000 to 15,000 pounds. The chemistry of the master heat is controlled but specification of many active elements and tramp elements has not been a rigorous part of existing superalloy practice. In light of the beneficial effect of low sulfur content, the master heat alloy material becomes critical. The master heat alloy materials are remelted and poured into ceramic molds with ceramic cores and then cast to produce the final blade, vane, or other articles of interest. This process is broadly referred to as investment casting. The final concentration of sulfur in the casting depends on the whole series of processing events including the melting practice, the ceramic-metal reaction, the vacuum processing and peripheral equipment.

The practice of melting and processing a master heat alloy material is an art in as much as details of the practice remain proprietary to the supplier. The composition of the starting raw material elements influences the final sulfur concentration. Melting in a MgO crucible or a crucible lined with MgO helps reduce the final sulfur content. Adding MgO, CaO, yttria, or an oxide of any rare earth element also helps to reduce sulfur in the melt. The general thinking is that these active elements tie up sulfur as sulfides or sulfates which are floated out as slag. This practice however not only reduces sulfur but leaves behind higher concentrations of active elements, such as magnesium and calcium, in the material. Whether these elements are present in the final master heat alloy material as elemental species, or as oxides or as any other compounds is not known. What is known is that the practice can produce master heat chemistry with less than about 1 ppm S and leave behind anywhere from 0 to 50 ppm of Mg, Ca, Y, or other rare earth active elements in the master heat ingot.

The master heat active element concentration strongly influences the concentration of final investment cast product. The higher the concentration of these elements in the master heat, the lower the sulfur content of the cast product. It is possible to increase the active element concentration in the final master heat alloy material by adding Ni—Mg or Ni—Ca binary alloys of known concentration of Mg and Ca. This practice may be required if the practice of adding oxides of active elements does not result in sufficient retention of active elements in the final master heat alloy material, even though the desired low concentration of sulfur might have been achieved.

Reducing the chance of sulfur pickup during casting is critical. One must distinguish between the master heats differing in Mg content to understand how to make coating processes more robust. In one case, the master heat chemistry consisting of (a) 50 ppm Mg and less than 1 ppm sulfur and the other case (b) 1 ppm Mg and less than 1 ppm sulfur. When one starts out with the master heat chemistry (a), a resulting single crystal casting tends to maintain the sulfur concentration below 1 ppm. However, when the master heat containing less than 1 ppm sulfur does not have much active elements as exemplified by (b), the single crystal casting produced contains higher sulfur concentrations than desired.

To insure low concentration of sulfur in the final investment cast product, it is imperative to start out with low sulfur in the master heat alloy material, but this by itself is not sufficient. It is highly desirable that no sulfur pick-up occurs during the casting process or if it does occur, it does not increase the total concentration of sulfur beyond 1 ppm. The use of ceramics and vacuum practice are two of the key elements of the investment casting process, which are relevant to the maintenance of low sulfur in superalloy articles. If equiaxed parts are desired, the molten metal may be allowed to solidify immediately. However, if columnar grain parts are desired, the mold may be withdrawn in one direction from the hot zone and the molten metal remains in contact with the ceramic for a longer time. The longer the time the hot metal remains in contact with the casting mold ceramic material or the furnace environment greater is the opportunity for it to get contaminated with sulfur. Also, the larger the surface to volume ratio of the casting, the higher the exposure of the molten metal to the surface.

Figure 6A:
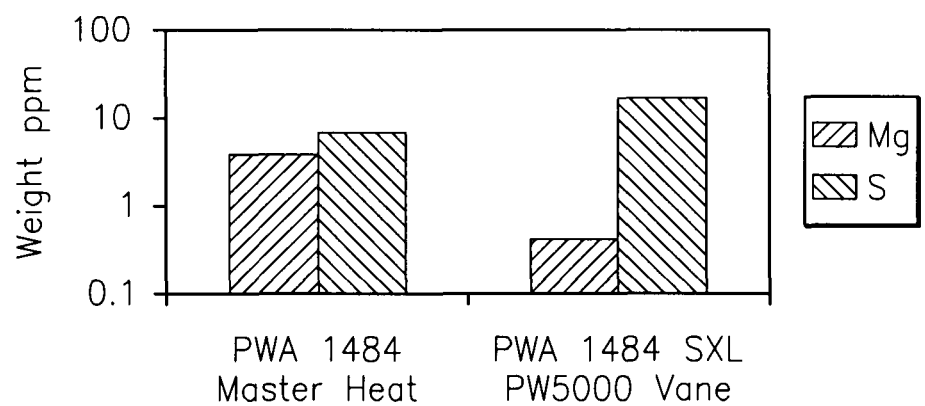
FIGS. 6A and 6B show a comparison between the magnesium and sulfur contents of prior art master heat materials and the master heat materials of the present invention.
Figure 6B:
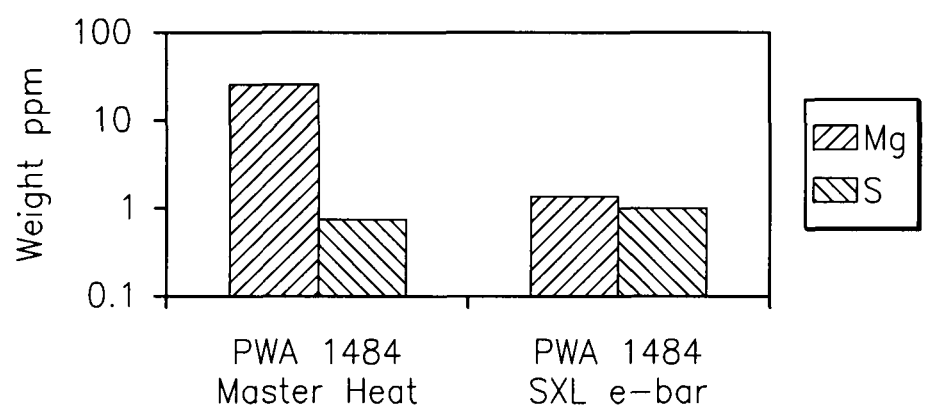
Figure 7A:
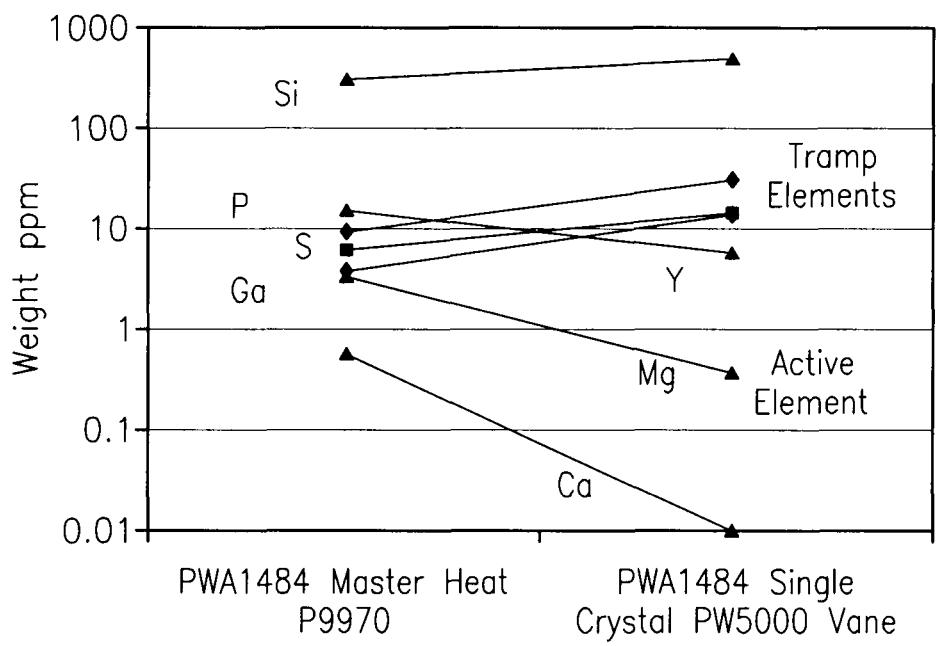
FIGS. 7A and 7B show the change in tramp and active element concentration with single crystal casting.
Figure 7B:
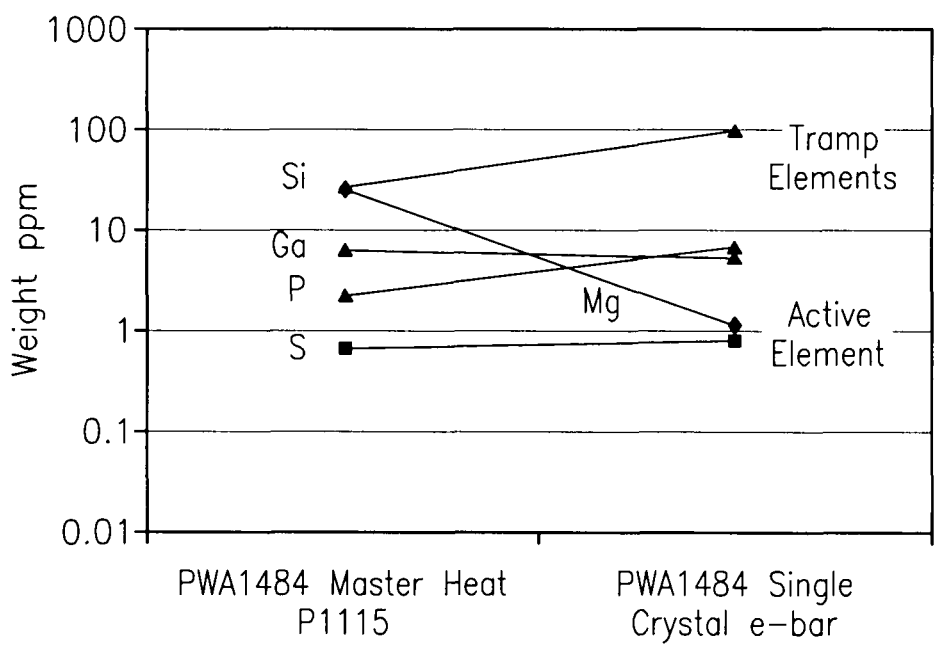

During casting of a superalloy, the concentration of active elements such as Mg, Ca, and Y generally decreases and the concentration of tramp elements, such as sulfur, phosphorous and gallium, generally increases as shown in FIGS. 6A, 6B, 7A, and 7B. Presented in FIGS. 6A and 6B are two simple bar charts showing how the starting concentration of the elements Mg and S in the master heat changes in single crystal castings. Note that in both examples in FIGS. 6A and 6B, the concentration of Mg always decreases, and concentration of S always increases, when the master heat is cast into single crystal form. However, in contrast to the example presented in FIG. 6A, when the Mg concentration is high (>20 ppm), the low starting S concentration (<1 ppm) can be maintained in the cast article example presented in FIG. 6B. The same information is presented in form of a line chart in FIGS. 7A and 7B to show variation of several active elements and tramp elements as a master heat is cast into a single crystal article. Note that in both examples presented in FIGS. 7A and 7B, the concentration of the active elements Y, Mg and Ca decreases, and concentration of tramp elements P, S, and Ga as well as Si increases upon casting. However, in contrast to the example presented in FIG. 7A, the gain in tramp element is relatively reduced when the starting concentration of active element Mg is high (>20 ppm) in the master heat of example in FIG. 7B. The increase in tramp elements is generally associated with the increase in the concentration of silicon, which strongly suggests that sulfur pick-up during casting is originating from ceramic/metal reactions rather than the furnace atmosphere. This is supported by anectodal evidence showing that when superalloy master heat is melted in a water-cooled copper hearth using electron beam, the active element and tramp element chemistry does not change. Since such melting practices take place under vacuum, any significant contamination from the furnace environment would have been noticeable. Also the experience with casting superalloys where retention of high amount of active elements such as Y is desired, indicates that use of a "high purity" ceramic core material is beneficial. The term "high purity" here refers to use of a low amount of silica binder in the core material.

Experience seems to favor the metal/ceramic reaction, as the primary factor influencing the increase in sulfur concentration relative to the starting master heat sulfur content during casting. This may explain why one needs high amounts of free active elements in the master heat to inhibit sulfur pick-up during casting. If one assumes that the active element in the master heat is in the elemental form, then given the high affinity of the active elements for sulfur, the following reactions are feasible:

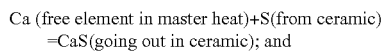
Ca (free element in master heat)+S(from ceramic) =CaS(going out in ceramic); and

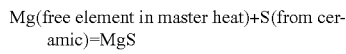
Mg(free element in master heat)+S(from ceramic)=MgS (going out in ceramic)

Thus, if the amount of free Ca+Mg in the molten metal during casting is not sufficient to stop the influx of sulfur from the ceramic shell mold or core materials, one will pick-up greater than desired levels of sulfur. This suggests that the larger the surface to volume ratio of the part, the higher the amount of active elements that is needed to inhibit sulfur pick-up.

While it is not known exactly in which form the active elements (Ca, Mg, Y) and sulfur reside in single crystal superalloys, one aspect is clear that in coated superalloys both the sulfur and active elements tend to segregate at the high energy interfaces. Since single crystals by definition do not have any high angle internal boundaries such as grain boundaries and the γ-matrix/γ'-precipitate boundary is coherent and therefore very low energy, the first boundary sulfur encounters is in the superalloy substrate/coating interface, and the next one is the outer surface of the coating. GDMS depth profiles show that sulfur tends to peak around the coating-substrate interface and the outer surface of the coating. Active elements (Mg, Ca, Y) also tend to segregate at the same locations suggesting that these active elements tend to remain associated with sulfur.

If the superalloy substrate is to be cast as a single crystal, then the master heat of the superalloy may contain active elements in such a way that [wt. ppm of Mg]+[(24/40)×(wt. ppm of Ca)]+[(24/89)×(wt. ppm of Y)]+[(24/atomic weight of any other active element)×(wt. ppm of the said active element)] is greater than or equal to 20.

It is generally recognized that elements in group IIA (Be, Mg, Ca, . . . ), group IIIA (Sc, Y, La, Ac), and group IVA (Ti, Zr, Hf) in the periodic table of elements, with very high affinity to oxygen and sulfur are active elements. It is also understood that elements La and Ac also imply a series of rare earth elements such as Ce, Gd, and Er, referred to as Lanthnides and Actinide series of elements, with atomic numbers ranging from 57 to 71 and 89 to 103, respectively. What is implied here is that for any nickel base superalloy, the final cast product may benefit by adding 20 ppm of Mg or equivalent sum total of active elements at the master heat stage, to inhibit increase in sulfur content during the casting stage.

It is known that thermodynamically 100% of the sulfur in nickel base alloys would like to be at high energy interfaces such as the free surfaces of a material at lower temperatures and a majority of it would like to be in the volume of the material at higher temperatures. However, at lower temperatures, sulfur cannot diffuse very fast and therefore sulfur is not found at the outer surface. At higher temperatures, sulfur can diffuse much faster through the metal and the consequence of these two extreme conditions is that the optimum amount of sulfur may be present at interfaces if the parts are exposed at some intermediate temperature e.g. about 1600 degrees Fahrenheit.

If an overlay-coating/superalloy substrate system contains a large area of interface, the system may be more tolerant to higher levels of sulfur in its impact on oxidation resistance. Since sulfur segregation between the outer protective alumina layer and the coating surface is a root cause of poor adherence of the protective aluminum oxide, it stands to reason that if more sulfur is segregated at the internal interfaces, less will be available to segregate to the critical outer surface. Equiaxed and columnar grain material thus may tolerate a higher threshold of sulfur. Also, any process such as roughening or shot peening of the superalloy substrate prior to coating, that will tend to increase the interface area between the coating and the substrate should be beneficial to improving coated oxidation resistance. Also addition of any oxide or nitride or other stable particles that can increase the internal surface area of the system should be beneficial. Any intermediate temperature heat treatment may segregate sulfur at these interfaces and if the process is irreversible, this too can be beneficial.

Most hot section components used in turbine engines are also coated with a ceramic coating. These coatings may be applied as a thermal barrier to enhance the temperature performance of the components. Such coatings may be applied over the bare metal or over the metallic coatings. In this context such metallic coatings are referred to as a bond coat. Nonetheless, the primary purpose of the bond coat is to provide oxidation resistance for the base superalloy should the ceramic coating fail. One of the other requirements of the bond coat is to allow the ceramic coating applied as a thermal barrier to remain adherent to the part. It is generally recognized that the ceramic coating is bonded to the bond coat through what is referred to as thermally grown oxide (TGO). Spallation or fall off of the ceramic coating can occur in two ways. The ceramic coating can come unbonded from the TGO, or the TGO can become unbonded from the metallic coating.

The unbonding of the TGO alumina scale from the metallic bond coat can occur easily if the interface between the TGO and the metallic coating is continuously or nearly continuously contaminated with a monolayer or thin film of sulfur. That is the same mechanism that reduces oxidation resistance of the overlay coated superalloy components. Since sulfur concentration and active elements in the base superalloy affect the coated oxidation resistance, it is appropriate to assume that they will influence the adherence of the ceramic thermal barrier coating. In fact, the sensitivity of the adherence of the ceramic coating to the base superalloy or bond coat will be even greater than coated oxidation resistance. When one is only concerned with oxidation resistance of the coated alloy, repeated spallation and reformation of the oxide layer is acceptable. However, when TBC is applied, the TBC ceramic coating spalls off with the first spallation of the oxide layer or the TGO. The critical role the substrate superalloy plays in controlling the adherence of ceramic coating is further supported by the observation that adherence of the ceramic coating to the same bond coat is significantly improved when the base alloy is a cobalt base alloy rather than a nickel base superalloy.

It is apparent that there has been provided herein a low sulfur nickel base substrate alloy and coating system with excellent high temperature oxidation resistance. It should be apparent that unforeseen alternatives, modifications, and variations may become apparent to one skilled in the art having read the foregoing description. Accordingly, it is intended to embrace those alternatives, modifications, and variations as fall within the broad scope of the appended claims.

What is claimed is:

1. A coated article having an improved coating oxidation life comprising:
   a cast superalloy substrate material having a composition which includes sulfur, which sulfur is present in an amount less than 1 ppm, wherein said substrate material has a composition which includes cobalt, said cobalt being present in an amount as high as 7 wt %, from 2 to 30 wt % chromium, from 2 to 20 wt % tungsten, rhenium, said rhenium being present in an amount as high as 10 wt %, niobium, said niobium being present in an amount as high as 10 wt %, from 10.1 to 15 wt % tantalum, from 1.6 to 5 wt % titanium, from 3 to 7 wt % aluminum, from 2.6 to 10 wt % molybdenum, iron, said iron being present in an amount as high as 5 wt %, ruthenium, said ruthenium being present in an amount as high as 10 wt %, iridium, said iridium being present in an amount as high as 5 wt %, zirconium, said zirconium being present in an amount from 0.3 to 2.0 wt %, hafnium, said hafnium being present in an amount as high as 3.0 wt %, silicon, said silicon being present in an amount from 1.1 to 2.0 wt %, and the balance nickel;
   an overlay coating containing nickel, cobalt, yttrium, chromium, and aluminum formed over a surface of said substrate material without any sulfur modifying element being pre-deposited onto said surface of the substrate; and
   an interface between said surface of the substrate and said overlay coating having a high surface area configured to segregate said sulfur; wherein at least one of the surface area between the overlay coating and the superalloy substrate material has been at least doubled by mechanical techniques selected from the group consisting of rough polishing, grit blasting, oil honing, rough machining; and
   results in a 50% enhanced sulfur segregation at the interface.

2. A coated article according to claim 1, wherein said substrate material is cast into a shape of a turbine engine component.

3. A coated article according to claim 1, wherein said substrate material has a single crystal microstructure.

4. A coated article according to claim 1, wherein said substrate material has a directionally solidified (DS) or columnar grain, or an equiaxed microstructure.

5. A coated article according to claim 1, wherein the superalloy substrate material has a gamma prime precipitate volume fraction anywhere from 20 to 75% and a dendrite size from 5 to 1000 microns.

6. A coated article according to claim 1, wherein said overlay coating has a composition comprising cobalt, said cobalt being present in an amount as high as 30 wt %, from 10 to 40 wt % chromium, from 5 to 35 wt % aluminum, from 0.01 to 5.0 wt % yttrium, niobium, said niobium being present in an amount as high as 5.0 wt %, tantalum, said tantalum being present in an amount as high as 5.0 wt %, iron, said iron being present in an amount as high as 10 wt %, molybdenum, said molybdenum being present in an amount as high as 5.0 wt %, rhenium, said rhenium being present in an amount as high as 5.0 wt %, ruthenium, said ruthenium being present in an amount as high as 5.0 wt %, iridium, said iridium being present in an amount as high as 2.0 wt %, platinum, said platinum being present in an amount as high as 30 wt.%, zirconium, said zirconium being present in an amount from 0.3 to 1 wt. %, hafnium, said hafnium being present in an amount as high as 5.0 wt %, silicon, said silicon being present in an amount from 1.1 to 5.0 wt %, and the balance nickel.

7. A coated article according to claim 1, wherein an outer surface of said overlay coating has a roughened surface between the outer surface and a thermally grown oxide (TGO) layer.

8. A coated article according to claim 1, further comprising a thermal barrier coating deposited over said overlay coating.

9. A coated article according to claim 8, wherein said thermal barrier coating comprises a ceramic coating.

10. A coated article according to claim 1, wherein said sulfur is present in an amount less than 0.3 ppm.

11. A coated article having an improved coating oxidation life comprising:
    a cast superalloy substrate material having a composition which includes sulfur, which sulfur is present in an amount less than 1 ppm, wherein said substrate material has a composition which includes cobalt, said cobalt being present in an amount as high as 7 wt %, from 2 to 30 wt % chromium, from 2 to 20 wt % tungsten, rhenium, said rhenium being present in an amount as high as 10 wt %, niobium, said niobium being present in an amount as high as 10 wt %, from 10.1 to 15 wt % tantalum, from 1.6 to 5 wt % titanium, from 3 to 7 wt % aluminum, from 2.6 to 10 wt % molybdenum, iron, said iron being present in an amount as high as 5 wt %, ruthenium, said ruthenium being present in an amount as high as 10 wt %, iridium, said iridium being present in an amount as high as 5 wt %, zirconium, said zirconium being present in an amount from 0.3 to 2 wt. %, hafnium, said hafnium being present in an amount as high as 3.0 wt %, silicon, said silicon being present in an amount from 1.1 to 2.0 wt %, and the balance nickel;
    an overlay coating containing nickel, cobalt, yttrium, chromium, and aluminum formed over a surface of said substrate material without any sulfur modifying element being pre-deposited onto said surface of the substrate, wherein an outer surface of said overlay coating has a roughened surface between the outer surface and a thermally grown oxide (TGO) layer; and
    an interface between said surface of the substrate and said overlay coating having a high surface area configured to segregate said sulfur; wherein at least one of the surface area between the overlay coating and the superalloy substrate material has been at least doubled by mechanical techniques selected from the group consisting of rough polishing, grit blasting, oil honing, rough machining; and
    results in a 50% enhanced sulfur segregation at the interface.

* * * * *